(12) United States Patent
Asamoto

(10) Patent No.: US 8,775,726 B2
(45) Date of Patent: Jul. 8, 2014

(54) TCAM EXTENDED SEARCH FUNCTION

(75) Inventor: Noriaki Asamoto, Shiga (JP)

(73) Assignee: International Business Machine Corporation, Armonk, NY (US)

( * ) Notice: Subject to any disclaimer, the term of this patent is extended or adjusted under 35 U.S.C. 154(b) by 154 days.

(21) Appl. No.: 13/560,866

(22) Filed: Jul. 27, 2012

(65) Prior Publication Data

US 2014/0032832 A1    Jan. 30, 2014

(51) Int. Cl.
G06F 12/00    (2006.01)

(52) U.S. Cl.
USPC ........................................... 711/108; 711/154

(58) Field of Classification Search
None
See application file for complete search history.

(56) References Cited

U.S. PATENT DOCUMENTS

2001/0002476 A1*   5/2001   Abdat ........................... 711/108

FOREIGN PATENT DOCUMENTS

| JP | 06075998 | 3/1994 |
|---|---|---|
| JP | 11282852 | 10/1999 |
| JP | 2001167125 | 6/2001 |
| JP | 2002374289 | 12/2002 |
| JP | 2004522383 | 2/2003 |
| JP | 2006005636 | 1/2006 |
| JP | 2011013913 | 1/2011 |

OTHER PUBLICATIONS

Kostas Pagiamtzis and Ali Sheikholeslami, Content-Addressable Memory (CAM) Circuits and Architectures: A Tutorial and Survey, IEEE Journal of Solid-State Circuits, vol. 41, No. 3, Mar. 2006.
Wikipedia, The Free Encycolpedia, Content-Addressable Memory, http://en.wikipedia.org/wiki/Content-addressable_memory, Last revised: Apr. 24, 2012.
Kostat Pagiamtzis, Content-Addressable Memory Introduction, http://www.pagiamtzis.com/cam/camintro/, Last Modified Jun. 25, 2007.

* cited by examiner

*Primary Examiner* — Shawn X Gu
(74) *Attorney, Agent, or Firm* — Kunzler Law Group

(57) ABSTRACT

A range determination module determines a search range of TCAM content values and a search criteria module creates a TCAM search value from a search range by combining common higher order bits with don't care lower order bits that change within the search range. A match module searches TCAM using the search value to determine a match count. A division module creates upper/lower sub-ranges by creating upper/lower midpoint content values within the search range. Upper sub-range is between an upper content value and the upper midpoint content value and lower sub-range is between the lower midpoint content value and a lower content value. The upper midpoint content value includes changing a most significant don't care bit to a 1 and remaining don't care bits to 0. The lower midpoint content value includes changing a most significant don't care bit to 0 and remaining don't care bits to 1.

20 Claims, 9 Drawing Sheets

TCAM EXTENDED SEARCH FUNCTION

FIELD

The subject matter disclosed herein relates to searching memory and more particularly relates to an extended search function for ternary content addressable memory ("TCAM").

BACKGROUND

Description of the Related Art

Content addressable memory ("CAM") is a type of computer memory that is typically used in very high speed searching applications. Unlike typical random access memory ("RAM") where a user supplies an address and the RAM returns a data word stored at the address, CAM is designed so that a user supplies a data word ("search value") and the CAM searches its entire memory to see if the data word matches a content value stored anywhere in the CAM. If a match between the supplied data word and the stored content value is found, the CAM may return one or more storage addresses where the word was found ("word line address"). CAM is designed so that each individual memory bit has its own associated comparison circuit.

Binary CAM typically allows data search values where each bit is a logic "1" or a logic "0." Ternary CAM or TCAM allows search values with bits in a "don't care" or "x" state. For example, a search value of 101x will return a word line address corresponding to content values of 1011 or 1010, if the content values were previously stored in the TCAM along with an associated word line address. TCAM has a limited set of search functions. One function available for searching TCAM is to input a specific search value and then to determine whether or not the TCAM contains any content value data matching the search value. If a content value matches a search value, a word line address associated with the content value may be returned.

BRIEF SUMMARY

An apparatus for searching memory is disclosed. A method and system also perform the functions of the apparatus. The apparatus includes a range determination module that determines a search range of content values within a ternary content addressable memory ("TCAM"). The search range is a difference between an upper content value and a lower content value. The apparatus includes a search criteria module that creates a search value for a TCAM search from a search range by combining higher order bits that do not change within the search range with a don't care state in place of lower order bits that change within the search range. The apparatus includes a match module that searches the TCAM using the search value to determine a match count. The match count includes a number of content values stored in the TCAM within the search range.

The apparatus includes a division module that creates an upper sub-range and a lower sub-range within the search range by creating an upper midpoint content value and a lower midpoint content value within the search range. The upper sub-range is a range between an upper content value of the search range and the upper midpoint content value and the lower sub-range is a range between the lower midpoint content value and a lower content value of the search range. The upper midpoint content value is created by changing a most significant bit of the search value in the don't care state to a logic "1" and the remaining bits in the don't care state to a logic "0." The lower midpoint content value is created by changing a most significant bit of the search value in the don't care state to a logic "0" and the remaining bits in the don't care state to a logic "1."

In one embodiment, the apparatus includes using the search criteria module with one of the upper sub-range and the lower sub-range to create a sub-range search value, using the match module to search the sub-range search value to determine a first sub-range match count, and also includes an alternate count module that subtracts the sub-range match count from a previous match count of the search range prior to division by the division module to determine a second sub-range match count. In another embodiment, the apparatus includes a division determination module that determines that a range is available for division by the division module in response to the match count of the range having a count of matching content value lines less than an upper search threshold and above a lower search threshold. In one example, the upper search threshold is a count of half of possible matching content values in the range. In another example, the lower search threshold is a count of matching content value lines of one. In one embodiment, the apparatus includes a sequence module that sequentially searches for content values within a sub-range in response to determining that a match count of a range comprises a count of matching content value lines that is greater than or equal to the upper search threshold. In another embodiment, a get address module that returns one or more word line addresses corresponding to one or more matching content value lines matching a sub-range search value in response to determining that a match count of the sub-range is less than or equal to the lower search threshold.

In one embodiment, the apparatus includes using the search criteria module, the match module, the alternate count module, and the division module for each sub-range with a match count less than the upper search threshold and greater than the lower search threshold until each sub-range match count has a count of matching content value lines that are greater than or equal to the upper search threshold or less than or equal to the lower search threshold. The embodiment further includes using, for each sub-range with a sub-range match count are greater than or equal to the upper search threshold or less than or equal to the lower search threshold, the sequence module to determine content values within the sub-range.

In one embodiment, the apparatus includes a sequential address module that sequentially stores word line addresses identified as having a content value matching the search value, the word line addresses stored in an address queue. In another embodiment, the apparatus includes a results return module that sequentially conducts a read operation of memory contents of the TCAM for each word line address stored in the address queue. The read operation returns a content value stored in the TCAM in connection with the word line address. In another embodiment, the apparatus includes a closest result module that determines a content value returned by the results return module that is a closest content value to a target content value. The target content value being within the search range of the upper content value and lower content value.

In one embodiment, the apparatus includes a search order module that determines that a search order is ascending in response to a start content value being the lower content value and an end content value being the upper content value and that determines that the search order is descending in response to a start content value being the upper content value and an end content value being the lower content value. In another embodiment, the apparatus includes choosing an upper sub-range or a lower sub-range for use with the search criteria module and choosing an ascending or a descending search order with the sequence module to determine content values within the sub-range such that content values determined by the sequence module are identified in an ascending order or descending order in response to the search order module determining an ascending or descending order. In another embodiment, the apparatus includes taking no action for a sub-range with a sub-range count of zero.

A method for searching memory includes determining a search range of content values within a TCAM. The search range is a difference between an upper content value and a lower content value. The method includes creating a search value for a TCAM search from a search range by combining higher order bits that do not change within the search range with a don't care state in place of lower order bits that change within the search range. The method includes searching the TCAM using the search value to determine a match count where the match count is a number of content values stored in the TCAM within the search range.

The method includes creating an upper sub-range and a lower sub-range within the search range by creating an upper midpoint content value and a lower midpoint content value within the search range. The upper sub-range is a range between an upper content value of the search range and the upper midpoint content value and the lower sub-range is a range between the lower midpoint content value and a lower content value of the search range. The upper midpoint content value is created by changing a most significant bit of the search value in the don't care state to a logic "1" and the remaining bits in the don't care state to a logic "0." The lower midpoint content value is created by changing a most significant bit of the search value in the don't care state to a logic "0" and the remaining bits in the don't care state to a logic "1."

In one embodiment, the method includes creating a sub-range search value for a TCAM search for the upper sub-range or the lower sub-range, searching the TCAM using the sub-range search value to determine a first sub-range match count, and subtracting the sub-range match count from a previous match count of the search range prior to division to determine a second sub-range match count. In another embodiment, the method includes determining that a range is available for division by the division module in response to the match count of the range being a count of matching content value lines less than an upper search threshold and above a lower search threshold. In another embodiment, the method includes sequentially searching for content values matching a sub-range search value in response to determining that a match count of a range comprises a count of matching content value lines that is greater than or equal to the upper search threshold. In another embodiment, the method includes returning one or more word line addresses corresponding to one or more matching content value lines matching a sub-range search value in response to determining that a match count of the sub-range is less than or equal to the lower search threshold.

In one embodiment, the method includes creating a sub-range search value for a TCAM search, searching the TCAM using the sub-range search value, determining a second sub-range match count, and dividing ranges into sub-ranges for each sub-range with a match count less than an upper search threshold and greater than a lower search threshold until each sub-range match count has a count of matching content value lines that are greater than or equal to the upper search threshold or lower than or equal to the lower search threshold. In another embodiment, the method includes, for each sub-range with a sub-range match count of matching content value lines that are greater than or equal to the upper search threshold or less than or equal to the lower search threshold, determining content values matching the sub-range search value.

A system for memory searching includes a TCAM and a control unit for searching the TCAM. The control unit includes, in one embodiment, a range determination module, a search criteria module, a match module, and a division module. The range determination module determines a search range of content values within the TCAM. The search range is a difference between an upper content value and a lower content value. The search criteria module creates a search value for a TCAM search from a search range by combining higher order bits that do not change within the search range with a don't care state in place of lower order bits that change within the search range. The match module searches the TCAM using the search value to determine a match count. The match count is a number of content values stored in the TCAM within the search range.

The division module creates an upper sub-range and a lower sub-range within the search range by creating an upper midpoint content value and a lower midpoint content value within the search range. The upper sub-range is a range between an upper content value of the search range and the upper midpoint content value and the lower sub-range is a range between the lower midpoint content value and a lower content value of the search range. The upper midpoint content value is created by changing a most significant bit of the search value in the don't care state to a logic "1" and the remaining bits in the don't care state to a logic "0." The lower midpoint content value comprising changing a most significant bit of the search value in the don't care state to a logic "0" and the remaining bits in the don't care state to a logic "1." In one embodiment, the system includes an electronic device that includes the TCAM and the control unit.

Another apparatus for searching memory includes a range determination module that determines a search range of content values within a TCAM where the search range is a difference between an upper content value and a lower content value. The apparatus includes a search criteria module that creates a search value for a TCAM search from a search range by combining higher order bits that do not change within the search range with a don't care state in place of lower order bits that change within the search range. The apparatus includes a match module that searches the TCAM using the search value to determine a match count and the match count is a number of content values stored in the TCAM within the search range.

The apparatus includes a division module that creates an upper sub-range and a lower sub-range within the search range by creating an upper midpoint content value and a lower midpoint content value within the search range. The upper sub-range is a range between an upper content value of the search range and the upper midpoint content value and the lower sub-range is a range between the lower midpoint content value and a lower content value of the search range. The upper midpoint content value is created by changing a most significant bit of the search value in the don't care state to a logic "1" and the remaining bits in the don't care state to a logic "0." The lower midpoint content value is created by changing a most significant bit of the search value in the don't care state to a logic "0" and the remaining bits in the don't care state to a logic "1." The apparatus includes a sub-range module that uses the search criteria module with the upper sub-range or the lower sub-range to create a sub-range search value and uses the match module to search the sub-range search value to determine a first sub-range match count.

The apparatus includes an alternate count module that subtracts the sub-range match count from a previous match count of the search range prior to division by the division module to determine a second sub-range match count. The apparatus includes a division determination module that determines that a range is available for division by the division module in response to the match count of the range comprising a count of matching content value lines less than an upper search threshold and above a lower search threshold. The apparatus includes a sequence module that sequentially searches for content values matching a sub-range search value in response to determining that a match count of a range has a count of matching content value lines that is greater than or equal to the upper search threshold. The apparatus includes a get address module that returns one or more word line addresses corresponding to one or more matching content value lines matching a sub-range search value in response to determining that a match count of the sub-range is less than or equal to the lower search threshold. The apparatus includes a sequential address module that sequentially stores word line addresses identified as having a content value matching the sub-range search value. The word line addresses stored in an address queue. The apparatus includes a results return module that sequentially conducts a read operation of memory contents of the TCAM for each word line address stored in the address queue.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION OF THE INVENTION

Figure 1:
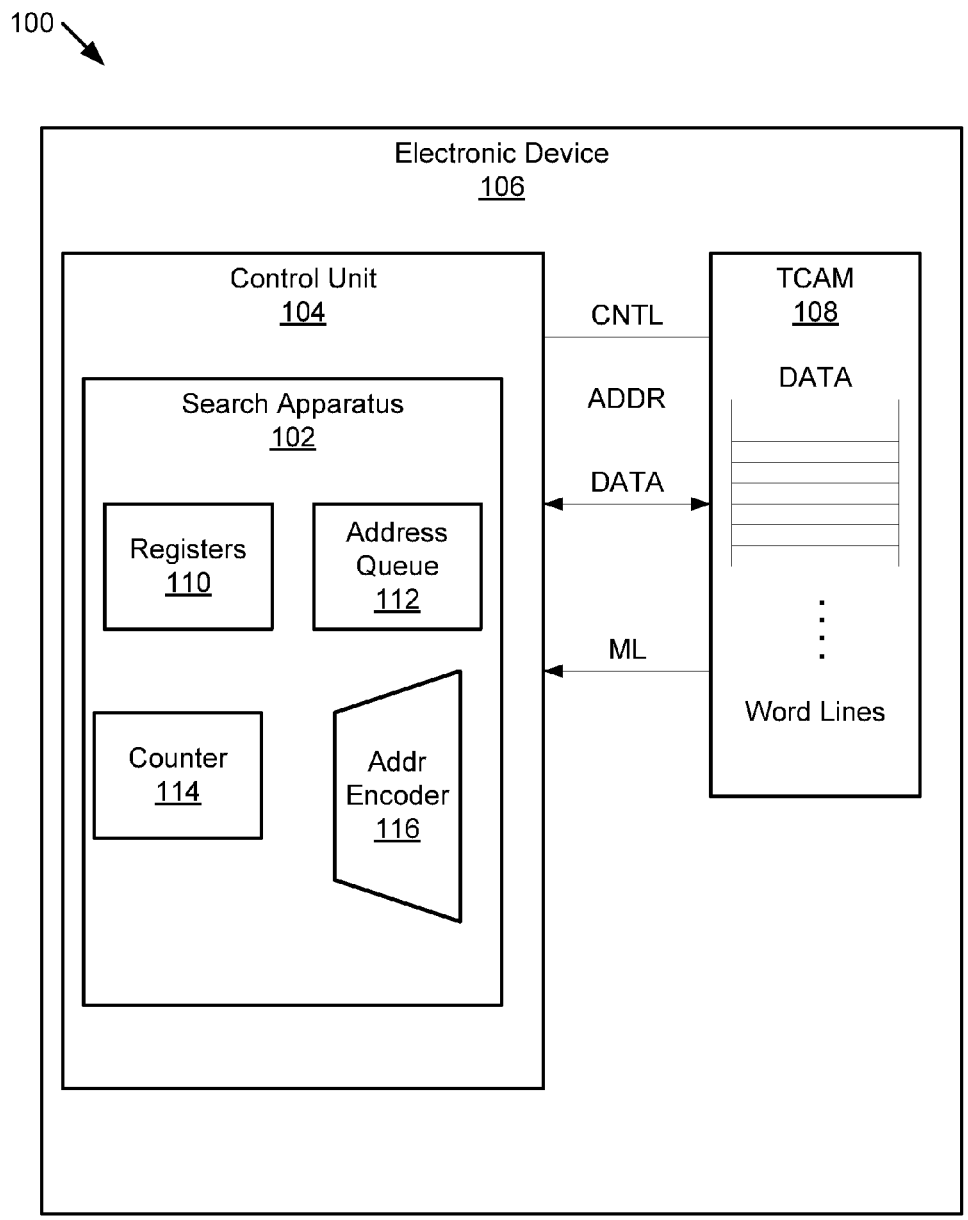
FIG. 1 is a schematic block diagram illustrating one embodiment of a system for an extended ternary content addressable memory ("TCAM") search function in accordance with the present invention.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, one or more aspects of the present invention may take the form of a computer program product embodied in one or more computer readable medium(s) having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of computer readable program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the computer readable program code may be stored and/or propagated on in one or more computer readable medium(s).

The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireline, optical fiber, Radio Frequency (RF), or the like, or any suitable combination of the foregoing In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor. The computer program product may be shared, simultaneously serving multiple customers in a flexible, automated fashion. The computer program product may be standardized, requiring little customization and scalable, providing capacity on demand in a pay-as-you-go model.

The computer program product may be stored on a shared file system accessible from one or more servers. The computer program product may be executed via transactions that contain data and server processing requests that use Central Processor Unit (CPU) units on the accessed server. CPU units may be units of time such as minutes, seconds, hours on the central processor of the server. Additionally the accessed server may make requests of other servers that require CPU units. CPU units are an example that represents but one measurement of use. Other measurements of use include but are not limited to network bandwidth, memory usage, storage usage, packet transfers, complete transactions etc.

Furthermore, the described features, structures, or characteristics of the embodiments may be combined in any suitable manner. In the following description, numerous specific details are provided, such as examples of programming, software modules, user selections, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by hardware and/or computer readable program code.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, hardware, or portion of code, which comprises one or more executable instructions of the program code for implementing the specified logical function(s).

The schematic flowchart diagrams and/or schematic block diagrams in the Figures illustrate the architecture, functionality, and operation of possible implementations. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Although various arrow types and line types may be employed in the flowchart and/or block diagrams, they are understood not to limit the scope of the corresponding embodiments. Indeed, some arrows or other connectors may be used to indicate only an exemplary logical flow of the depicted embodiment.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable program code.

The description of elements in each figure may refer to elements of proceeding figures. Like numbers refer to like elements in all figures, including alternate embodiments of like elements.

FIG. 1 is a schematic block diagram illustrating one embodiment of a system 100 for an extended ternary content addressable memory ("TCAM") search function in accordance with the present invention. The system 100 includes a search apparatus 102 in a control unit 104 and TCAM 108 in an electronic device 106. The search apparatus 102 may include registers 110, an address queue 112, a counter 114, and an address encoder 116. The elements of the system 100 are described below.

The apparatus 100 includes a search apparatus 102. In one embodiment the search apparatus 102 is in a control unit 104. The search apparatus 102 is adding extended search functions to typical TCAM search functions. The extended search functions are described in more detail below. The control unit 104, in one embodiment, is a memory controller. In another embodiment, the control unit 104 implements search functions in conjunction with a memory controller. The TCAM 108 may include data connected with word lines or address lines to access data stored in the TCAM 108. In one embodiment, control lines ("CNTL") allow the control unit 104 to control searching the TCAM 108. Address lines ("ADDR") running to the TCAM 108 may be asserted by the control unit 104 to read/write a content value from/to the TCAM 108. Data lines ("DATA") between the control unit 104 and the TCAM 108 may allow data to be written to and read from the TCAM 108 or a search value to be searched by the TCAM 108. As a result of a search of the TCAM 108, matching content value lines are outputted from the TCAM 108 in the form of an ML signal (i.e. matching line). The search apparatus 102 may count a number of matching content value lines for a search. For example, the counter 114 may count the number of matching content value lines.

The address encoder 116 typically receives the ML signals as input and returns a word line address in response to one or more ML signals being high. In one embodiment, the address encoder 116 returns a single word line address in response to a single matching content value line being high. In another embodiment, the address encoder 116 has a hierarchy where a predetermined word line address is returned when certain match lines are high. For example, where a content value may be 101x and another content value may be 10xx. A search value of 1011 will satisfy both content values so the address encoder 116 may select a word line address associated with 101x over that of 10xx. In another embodiment, the address encoder 116 may arbitrarily select a matching content value line where multiple matches exist. In another embodiment, as described below, where multiple matching content value lines result from a particular search value, the division module 208 may divide a range associated with the search value.

The electronic device 106 may be any device that may use TCAM. The electronic device 106 may be any device that may store data where searching is achieved by using a content value. Typical TCAM applications such as network routers may use a TCAM function to determine a hit or a miss where the particular values associated with a hit are not required. Electronic devices typically have an ability to enumerate content values in a specified range. Typically such enumeration has been done in the past by software which may be a slow. Embodiments of the present invention may provide a way to quickly search and enumerate the content values in a range by hardware, thus extending TCAM functionality. The electronic device 106 may be a router or switch or other computer networking device. The electronic device 106 may also be a mainframe computer, workstation, desktop computer, laptop computer, or any other computing device using TCAM.

In one embodiment, the search apparatus 102 includes one or more registers 110 to store search results, data, starting and ending content values, and other information useful for searching TCAM. The search apparatus 102 may also include at least one address queue 112 that may be used to store word line addresses that match search criteria. The registers 110 and address queue 112 will be discussed in more detail below.

Figure 2:
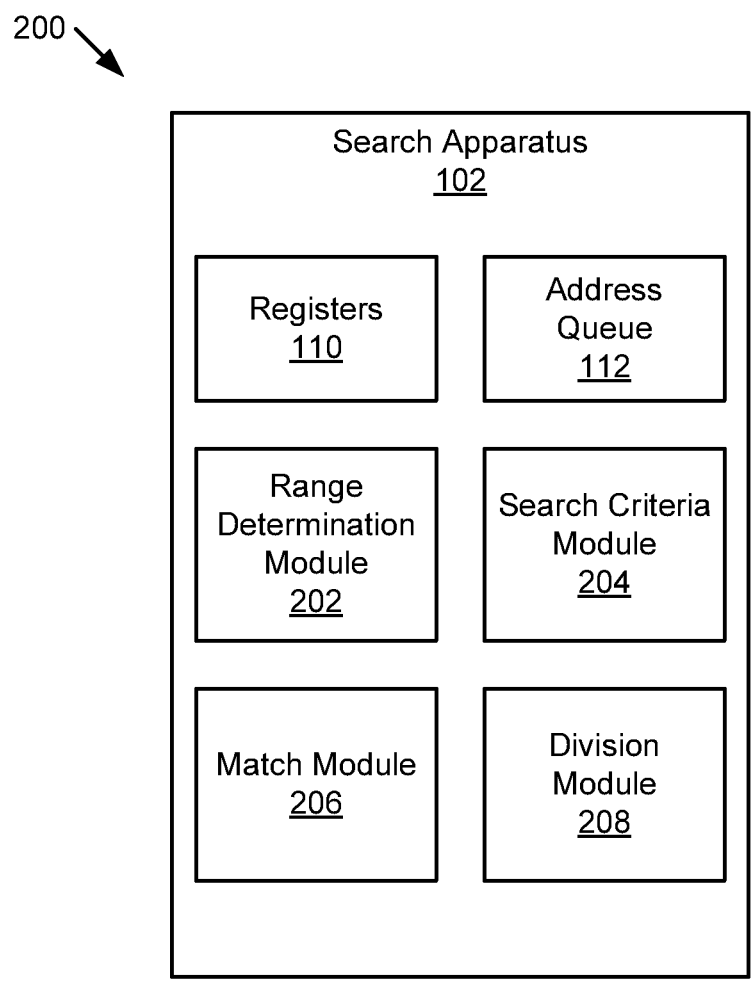
FIG. 2 is a schematic block diagram illustrating one embodiment of an apparatus for an extended TCAM search function in accordance with the present invention.

FIG. 2 is a schematic block diagram illustrating one embodiment of an apparatus 200 for an extended TCAM search function in accordance with the present invention. The apparatus 200 includes one embodiment of a search apparatus 102, which may include registers 110, an address queue 112, a counter 114, and an address encoder 116 that are similar to those described with regard to the system 100 of FIG. 1. In addition, the registers 110, address queue 112, counter 114, and address encoder 116 may be included in one or more modules 202-208. The search apparatus 102 may also include a range determination module 202, a search criteria module 204, a match module 206, and a division module 208, which are described below.

In one embodiment, the search apparatus 102 includes a range determination module 202 that determines a search range of content values within the TCAM 108. The search range includes a difference between an upper content value and a lower content value. For example, if an upper content value and a lower content value are different, the difference between the upper and lower content values is the search range. In one embodiment, the search range is an initial search range where one content value is a start content value and one content value is an end content value. In one embodiment, if the start content value is greater than the end content value, the search apparatus 102 may assemble results in a descending order. In another embodiment, if the start content value is less than the end content value, the search apparatus 102 may assemble results in an ascending order. In other embodiments, another command or variable may set an ascending or descending order. In another embodiment, results are not in an ascending or descending order.

In one embodiment, the range determination module 202 may determine a search range of content values within the TCAM 108 for a range that is less than an initial range, which may be called a sub-range. For example, an initial range may be divided by the division module 208 and the range determination module 202 may use results of the division module 208 to determine a search range.

Content values within the TCAM 108, in one embodiment, are combinations of bits in a high state (logic "1"), a low state (logic "0"), and a don't care state "x." a content value typically corresponds with a particular match line. Match lines may be output in the form of an ML signal and may be input to an address encoder 116. In response to asserting a particular match line to the address encoder 116, the address encoder 116 may output a word line address associated with the match line and content value in the TCAM 108. For example, a MAC address received by a router may be a 1010_1100. The TCAM 108 may include a location with a content value of 1010_xxxx, where the xxx are bits in a don't care state. The MAC address may therefore meet the 1010_xxxx criteria resulting in the TCAM 108 asserting a particular match line. The match line in a high state may result in a word line address being returned. The word line address may correspond to a port location where a data message may be sent. For example, the word line address may be input to a random access memory ("RAM") storing port data. Typically, a content value, as used herein, is a string of input data bits and may correspond to a location in the TCAM 108 and application of the string of data bits may result in the TCAM 108 returning a stored word line address.

The apparatus 200 includes, in one embodiment, a search apparatus 102 with a search criteria module 204 that creates a search value for a TCAM search from a search range by combining higher order bits that do not change within the search range with a don't care state in place of lower order bits that change within the search range. For example, if an upper content value for a search range is 1111_1111 and a lower content value for the search range is 1100_0000, the top two higher order bits are 11 and don't change within the search range while the six lower order bits change. The search criteria module 204 replaces the six lower order bits with a don't care state, denoted by an "x" so the search value becomes 11xx_xxxx. A search in the TCAM 108 may then be performed using the search value 11xx_xxxx. Note that a search range may not always start with the changing bits in the upper content value being all ones and all zeros in the lower content value. A search value may therefore include content values outside the desired range. This situation is discussed in more detail with regard to FIG. 5.

The apparatus 200 includes, in one embodiment, a search apparatus 102 with a match module 206 that searches the TCAM 108 using the search value to determine a match count. The match count includes a number of content values stored in the TCAM 108 within the search range. In one embodiment, the match module 206 returns a match count that is the number of matches. In another embodiment, the match module 206 returns additional information, such as match line information. For example, if a search value of 11xx_xxxx is used to search the TCAM 108, the match module 206 may return 12 as the match count. In this instance, there are six don't care bits in the search value so there are $2^6=64$ possible matches so the 12 matches by the match module 206 indicates that of the 64 possible content values stored in the range of the search value, there are 12 locations with a content value that fall within the search range. If 1101_10xx is a content value stored in the TCAM 108, this content value would produce a "hit" and would increase the number of matches. The 1101_10xx content value is typically associated with data stored at this content value in the TCAM 108. The stored data may indicate a port address or other useful information.

The apparatus 200, in one embodiment, includes a division module 208 that creates an upper sub-range and a lower sub-range within the search range. The division module 208 creates the upper and lower sub-ranges by creating an upper midpoint content value and a lower midpoint content value within the search range. The upper sub-range is a range between an upper content value of the search range and the upper midpoint content value and the lower sub-range is a range between the lower midpoint content value and a lower content value of the search range.

The upper and lower midpoint content values are created from the search value. The upper midpoint content value is created by changing a most significant bit of the search value in the don't care state to a logic "1" and the remaining bits in the don't care state to a logic "0." Likewise, the lower midpoint content value is created by changing a most significant bit of the search value in the don't care state to a logic "0" and the remaining bits in the don't care state to a logic "1." Going back to the previous example, if the search range is 1111_1111 to 1100_0000, the search value is 11xx_xxxx, the upper midpoint content value becomes 1110_0000. The lower midpoint content value becomes 1101_1111. The upper sub-range is a range between the upper content value of the search range, 1111_1111, and the upper midpoint content value of 1110_0000. The lower sub-range is from the lower midpoint content value of 1101_1111 to 1100_0000. Note that the upper midpoint content value and the lower midpoint content value are adjacent content values. In embodiments explained below, the division module 208 may be used to divide a sub-range into other sub-ranges.

The search criteria module 204, in one embodiment, may then be used to create a search value for the sub-range. For example, for the upper sub-range, the search criteria module 204 may create a search value of 111x_xxxx and may create a search value for the lower sub-range of 110x_xxxx. The match module 206 may then be used to search the TCAM 108 of a sub-range if necessary. Determining if a search by the match module 206 is to be performed will be explained further with regard to FIG. 3.

Figure 3:
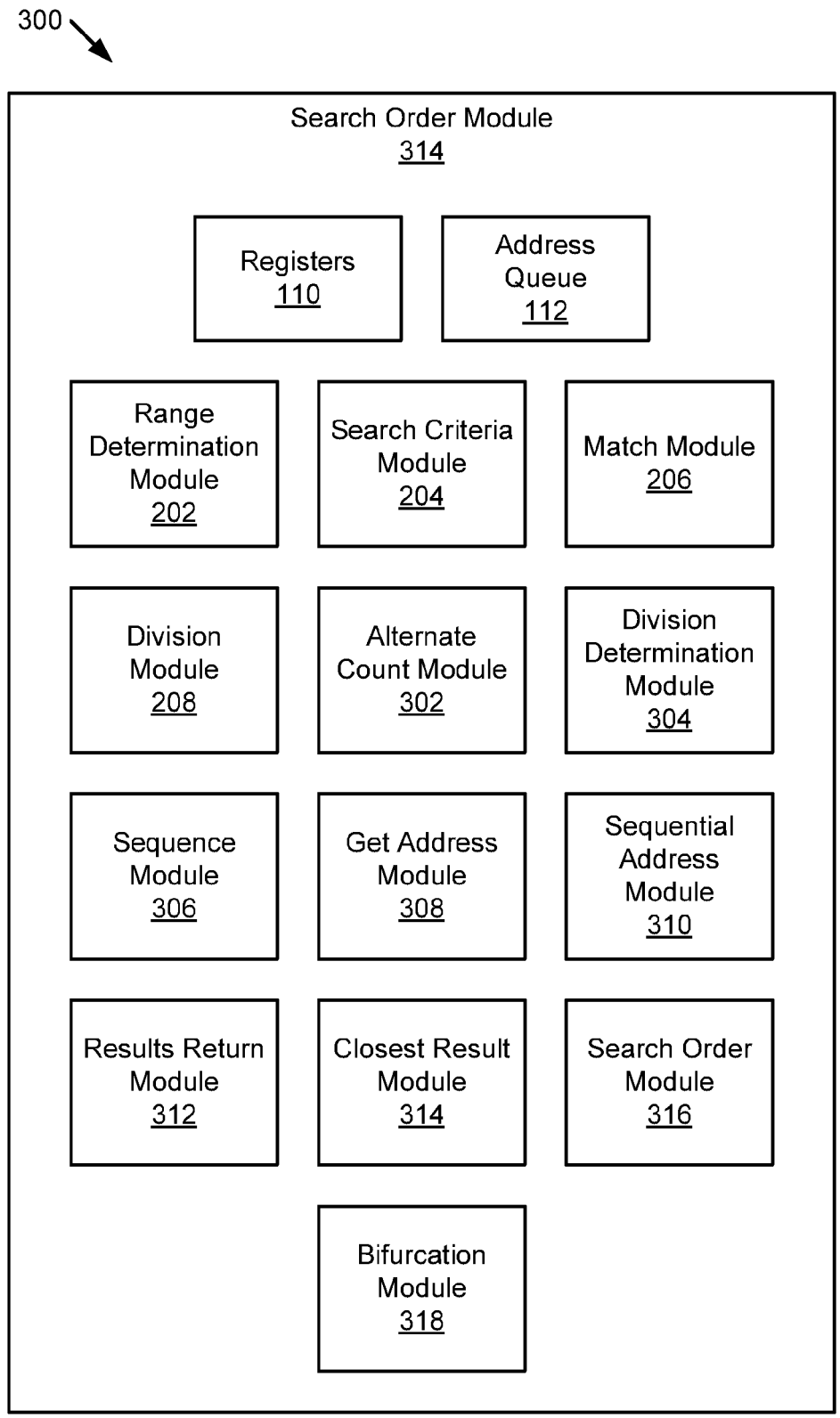
FIG. 3 is a schematic block diagram illustrating another embodiment of an apparatus for an extended TCAM search function in accordance with the present invention.

FIG. 3 is a schematic block diagram illustrating another embodiment of an apparatus 300 for an extended TCAM search function in accordance with the present invention. The apparatus 300 includes one embodiment of a search apparatus 102, which may include registers 110 and at least one address queue 112, that are similar to those described with regard to the system 100 of FIG. 1 and a range determination module 202, a search criteria module 204, a match module 206, and a division module 208, which are described with regard to the apparatus 200 of FIG. 2. The apparatus 300, in various embodiments, may also include an alternate count module 302, division determination module 304, a sequence module 306, a get address module 308, a sequential address module 310, a results return module 312, a closest result module 314, a search order module 316, and a bifurcation module 318, which are described below. The modules 302-318 may be in the search apparatus 102.

In one embodiment, the apparatus 300 includes an alternate count module 302 that subtracts the sub-range match count from a previous match count of the search range prior to division by the division module 208 to determine a second sub-range match count. For example, if the division module 208 divides a range and creates and upper sub-range and a lower sub-range, the match module 206 may determine a match count for a sub-range. The alternate count module 302 may then use a match count of the range before division and a match count of the searched first sub-range to determine a match count for the second sub-range. Typically, if the match count of the undivided range is a certain number and the match count for a first sub-range is another number, the match count for the second sub-range should be the difference between the match count of the undivided range and the match count of the first range.

For example, if the match count of the initial range discussed above is 12, the match count of the upper sub-range may be 9. The alternate count module 302 may then determine that the match count of the lower sub-range is 12−9=3. Determining the match count of the second sub-range using the alternate count module 302 may use fewer resources than searching the second sub-range with the match module 206. In an alternate embodiment, the match module 206 determines the match count of the second sub-range.

In certain embodiments, the division module 208 may divide a range under certain conditions. In one embodiment, if the match module 206 returns a match count of zero, the search apparatus 102 typically would not do any further processing on the sub-range with the match count of zero. If the match module 206 returns a match count that is high, it may be beneficial to search the content values of the range and identify content values that match the search value. In one embodiment, searching is sequential.

In one embodiment, the apparatus 300 includes a division determination module 304 that determines that a range is available for division by the division module 208 in response to the match count of the range, as determined by the match module 206, having a count of matching content value lines less than an upper search threshold and above a lower search threshold. In one embodiment, the upper search threshold is a count of half of possible matching content value lines in the range and the lower search threshold is a count of matching content value lines of one.

For example, if a range is 1111__1111 to 1110__0000, there are $2^5=32$ possible matching content values in the range so if a match count for the range is 9, the match count is less than the upper search threshold, which may be 16, and the match count is greater than a lower search threshold of one and the division determination module 304 typically would determine that the range is available for division by the division module 208. In other embodiments, the upper and lower search thresholds may be other numbers. The upper search threshold may be chosen to balance resources used for dividing ranges to minimize searching with resources used for sequentially searching a range. Likewise the lower search threshold may be chosen to balance resources for searching and resources for dividing ranges.

In one embodiment, the apparatus 300 includes a sequence module 306 that sequentially searches for content values within a sub-range in response to determining that a match count of a range includes a count of matching content value lines that is greater than or equal to an upper search threshold. Where a match count is high relative to possible matches in a range, it may be more beneficial to search the content values in the range. The sequence module 306 may search all content values in a range or may stop searching when a number of matching content value lines equals the match count for the range or when the search reaches and end content value. The sequence module 306 starts at an upper or lower content value of the search range, depending on whether the search is ascending or descending. If a search range is 1111__1111 as the upper content value and 1110__0000 as the lower content value of the range and the search is descending, the sequence module 306 starts at the upper content value of 1111__1111 and inputs this upper content value to the TCAM 108 as a search value. In one embodiment, the sequence module 306 then decrements the current search value (e.g. the next search value is 1111__1110) and continues this process until the number of hits equals the match count for the range or the search value reaches the end content value. Note that the end content value may be different than the lower content value of the range.

The apparatus 300 may also include a get address module 308 that returns one or more word line addresses corresponding to one or more matching content value lines matching a sub-range search value where the match count of the sub-range is less than or equal to the lower search threshold. In one embodiment, the lower search threshold is one. Where the match count is one, typically one matching content value line is high and the get address module 308 returns a corresponding word line address. The upper and lower search thresholds may be the same as for the division determination module 304. Sequentially searching a range when a match count is equal to or less than a lower search threshold may be more efficient than continuing to divide a range. For example, when the lower search threshold is one, the get address module 308 may simply return the word line address corresponding to the single matching content value line that generated the match count of one at the time the match module 206 without generating a new search.

The search apparatus 102, in one embodiment, may use the range determination module 202, the search criteria module 204, the match module 206, the alternative count module 302, and the division module 208 for each sub-range with a match count less than the upper search threshold and greater than the lower search threshold until each sub-range match count has a count of matching content value lines that are greater than or equal to the upper search threshold or less than or equal to the lower search threshold. The search apparatus 102 may also use, for each sub-range with a sub-range match count are greater than or equal to the upper search threshold, the sequence module 306 to determine content values within the sub-range. When the match count is one, the search apparatus 102 may also use the get address module 308 to return the word line address corresponding to the matching content value line returned by the match module 206. Eventually, the search apparatus 102 may find all matching content values in the search range.

In another embodiment, the apparatus 300 includes a sequential address module 310 that sequentially stores word line addresses identified as matching the search value in an address queue. For example, as the sequence module 306 sequentially searches content values in the search range by searching various sub-ranges, the sequential address module 310 may store identified word line addresses in an address queue. Where the sequence module 306 searches the TCAM 108 sequentially and where ranges are chosen in an order to preserve an overall sequential order, the sequential address module 310 may naturally store word line addresses in sequence.

In one embodiment, the apparatus 300 includes a results return module 312 that sequentially conducts a read operation of memory contents of the TCAM 108 for each word line address stored in the address queue 112. In one example, a read operation receives a word line address and reads the TCAM 108 and then returns an associated content value. In one embodiment, the results return module 312 queries the TCAM 108 for each word line address in the address queue 112 to retrieve a content value stored in connection with the associated word line address. The results return module 312, in one embodiment, returns results to a user. In another embodiment, the results return module 312 returns results to an application that requested a search of a range in the TCAM 108.

In one embodiment, the apparatus 300 includes a closest result module 314 that returns a content value that is closest to a target content value. The target content value, in one embodiment, is a content value within the search range. The search range is between an upper content value and a lower content value. For example, the search range is between the start content value and the end content value.

In one embodiment, the apparatus 300 includes a search order module 316 that determines that a search order from the start content value and end content value. For example, the search order module 316 may determine that a search order is ascending when a start content value is the lower content value and an end content value is the upper content value. In another example, the search order module 316 determines that the search order is descending when a start content value is the upper content value and an end content value is the lower content value.

Where the search order module 316 determines that a search is ascending or descending, the search order module 316 may choose an upper sub-range or a lower sub-range for use with the search criteria module 204 and may choose an ascending or a descending search order with the sequence module 306 to determine content values within the sub-range such that content values determined by the sequence module 306 are identified in an ascending order or descending order. For example, a user may want results in a descending order and may select a start content value greater than an end content value. The search order selection module 316 may organize selection and processing of sub-ranges, search order of the sequence module 306, etc. so that search results are organized in a descending order.

In one embodiment, the apparatus 300 includes a bifurcation module 318 that creates a midpoint in a search range and creates two search ranges for two searches. The bifurcation module 318 is described further with regard to FIG. 5.

Figure 4:
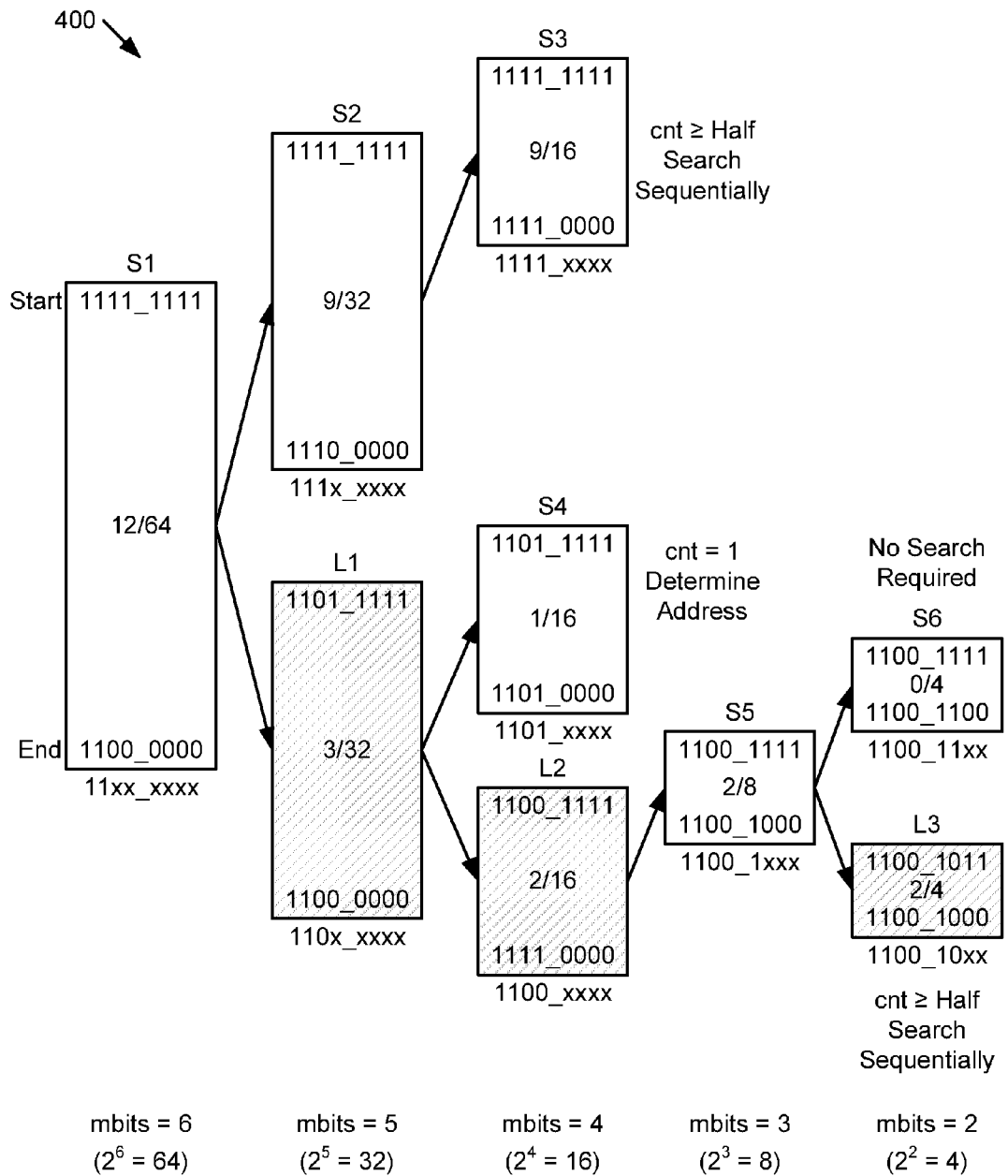
FIG. 4 is an example of a search operation in descending order in accordance with the present invention.

FIG. 4 is an example 400 of a search operation in descending order in accordance with the present invention. The example 400 may be a result of the search apparatus 102 and associated modules. The example 400 shows a typical start range S1 with a start content value of 1111_1111 and an end content value of 1100_0000. The range determination module 202 may determine the start and end content values. In one embodiment, the search order module 316 may determine that the start content value is greater than the end content value so that a descending order is selected. The example 400 corresponds to a descending order search. One of skill in the art will recognize from the example how an ascending search is executed. For simplicity, the start and end content values are eight bits. One of skill in the art will recognize that often a TCAM 108 may include content values of many more bits.

In one embodiment, the search criteria module 204 determines that the search value for the range S1 is 11xx_xxxx. In this example 400, the two highest order bits do not change over the range S1 and the remaining six bits change so the lower six bits are replaced with a don't care state ("x"). The match module 206 searches the range S1 using the search value 11xx_xxxx and determines that there is a match count of 12 matches. The masked bits ("mbits") are the don't care bits and there are six mbits in the range S1 so there are $2^6=64$ possible matches in the range S1. The division determination module 304 determines that the 12 matches are less than half of the 64 possible matches so the division module 208 divides the range into two ranges S2 and L1. The division module 208 determines a lower midpoint content value of 1110_0000 and an upper midpoint content value of 1101_1111. In one embodiment, the upper midpoint content value is found by changing the highest order masked bit of the search value for range S1 to a logic "1" and the remaining five masked bit to a logic "0." In another embodiment, the lower midpoint content value is found by changing the highest order masked bit of the search value for range S1 to a logic "0" and the remaining five masked bit to a logic "1."

The search range for sub-range S2 is 1111_1111 to 1110_0000. The search criteria module 204 is used for range S2 to create a search value of 111x_xxxx. The match module 206 searches using the S2 search value and determines that the match count is 9 matches. The alternate count module 302 subtracts the match count of range S2 from the match count of range S1 to determine the match count of L1. So 12–9=3 and the match count of range L1 is 3. In one embodiment, information about range L1, such as the match count, range, number of masked bits, etc. are stored on a stack for later processing.

The number of masked bits for range S2 is five so the possible matches are $2^5=32$ and 9 is less than half of 32 so the division determination module 304 determines that the range S2 is available for division. The division module 208 divides range S2 and an upper sub-range from S2 is range S3. The upper content value for range S3 is again 1111_1111 while the upper midpoint content value of range S3 is 1111_0000. The search criteria module 204 creates a search value of 1111_xxxx and the match module 206 determines that the match count for range S2 is 9. Since the match count of S3 is the same as the match count of range S2, a lower sub-range of range S2 is ignored since the alternate count module 302 will determine that the lower sub-range match count is zero.

The number of masked bits for range S3 is four so there are $2^4=16$ possible matches. The sequence module 306 determines that the match count for range S3 is 9 which is more than half of the 16 possible matches in range S3 so the sequence module 306 sequentially searches range S3 decrementing the search value from 1111_1111 to 1111_0000 to find matching content value lines. As a matching content value line is found, the sequential address module 310 returns a corresponding word line address and stores sequentially the matching word line addresses returned by the sequence module 306 in an address queue 112. In some cases, there may be plural matching content values for a certain search value (for example, in a case where the same content value is contained in the TCAM 108). In such a case, arbitrarily one matching content value line is selected. The search process ends either when the number of matching content values reaches the match count or when the search value is smaller than the end content value.

Since there are no more content values to be found in S2 or the ranges that are split from S2 (i.e. range S3), the search apparatus 102 processes range L1. The search apparatus 102 may pop information about range L1 from the stack. The division determination module 304, in one embodiment, determines that the match count for range L1 is less than half of the possible matches (i.e. less than 32) and is greater than one so the range L1 is available for division. The division module 208 divides the range L1 and creates sub-ranges S4 and L2. The division module 208 creates an upper midpoint content value of 1101_0000 and a lower midpoint content value of 1100_1111. The range for S4 is then 1101_1111 to 1101_0000 and the search criteria module 204 creates a search value of 1101_xxxx. The match module 206 searches the TCAM 108 in range S4 and determines a match count of one. The alternate count module 302 subtracts the match count of range S4 from the match count of range L1 to determine the match count of L2. So 3–1=2 and the match count of range L2 is 2. In one embodiment, information about range L2, is stored on the stack for later processing.

The match count of range S4 is one so the get address module 308 returns a word line address that corresponds to the one matching content value line that generated a match count of one. The sequential address module 310 stores the resulting word line address in the address queue 112 sequentially with the word line addresses from range S3. The search apparatus 102 pops the information about range L2 from the stack and the division determination module 304 determines that the match count for range L2 (i.e. 2) is less than half of the possible 16 matches and is greater than one so the division module 208 divides range L2 and creates an upper midpoint content value of 1100_10000. The resulting upper sub-range is 1100_1111 to 1100_1000 and the search criteria module 204 creates a search value of 1100_1xxx. The match module 206 searches range S5 using the search value and returns a match count of 2. Since the match count of L2 equals the match count of S5, lower sub-range information is not pushed to the stack.

The division determination module 304 determines that the match count of range S5 is less than half of the possible matches (i.e. $2^6$=8) and is greater than one so the division module 208 divides the range S5 again and creates an upper midpoint content value of 1100_1100 and a lower midpoint content value of 1100_1011. An upper sub-range S6 is from 1100_1111 to 1100_1100 and a lower sub-range L3 is from 1100_1011 to 1100_0000. The search criteria module 204 creates a search value of 1100_11xx. The match module 206 returns a match count for range S6 of zero so the search apparatus 102 takes no further action for range S6. The alternate count module 302 subtracts the match count of range S6 from the match count of range S5 to determine the match count of range L3 (i.e. 2−0=2). The search apparatus 102 may momentarily push information about range L3 to the stack, but since the match count of range S6 is zero, the search apparatus 102 would pop the information about L3 from the stack. In another embodiment, the search apparatus 102 recognizes that no processing is required for range S6 so the information from L3 is not pushed and popped from the stack.

The sequence module 306 determines that the match count of range L3 is equal to half of the possible matches in range L3 (i.e. $2^2$=4) so the sequence module 306 searches the TCAM 108 in the range L3 sequentially to identify content values that within the range L3. The sequential address module 310 stores word line addresses returned by the sequence module 306 and stores the word line addresses sequentially in the address queue 112. The results return module 312 may then use the word line addresses in the address queue 112 to read the TCAM 108 and to sequentially return content values associated with each word line address in the address queue 112.

Figure 5:
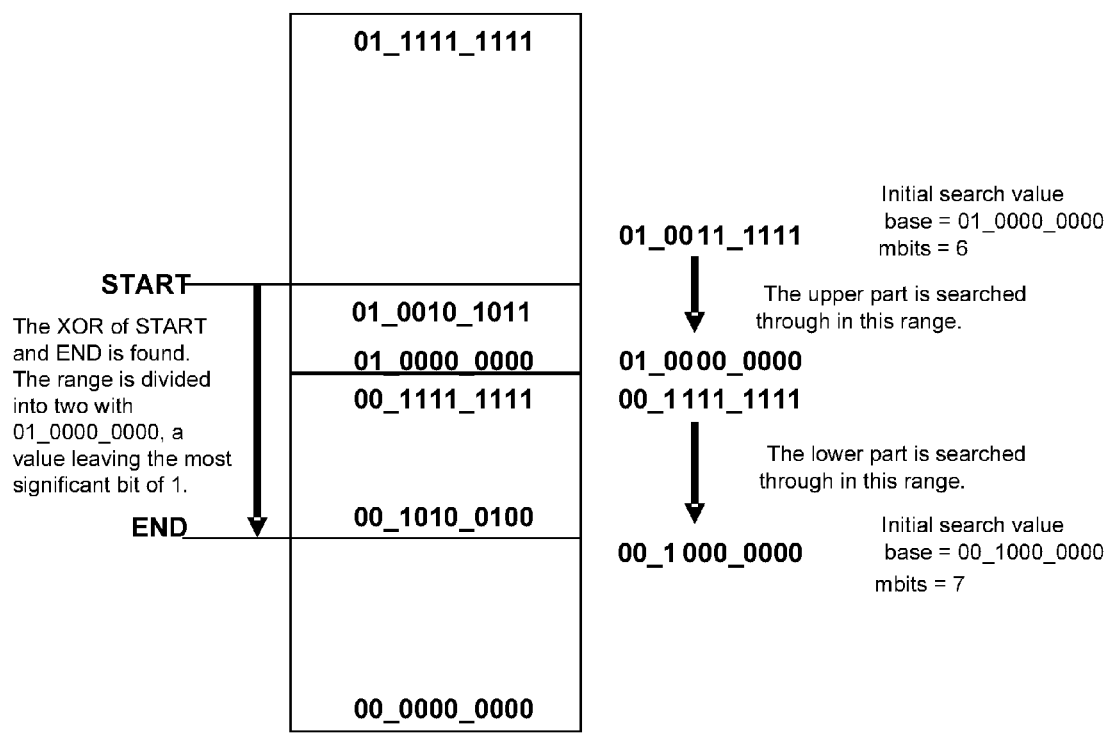
FIG. 5 is an example of a search range in accordance with the present invention.

FIG. 5 is an example 500 of a search range in accordance with the present invention. The search range differs from the search range of the example 400 of FIG. 4 in that a search value may search content values above the upper start content value or below the lower end content value. In one embodiment, a bifurcation module 318 divides an initial range between the start and end content values, but may do so differently from the division module 208. The bifurcation module 318, in one embodiment, uses an XOR function on each bit of both the start and end content values to create a midpoint. In the example 500, the start content value is 01_0010_1011 and the end content value is 00_1010_0100. In an XOR operation, a 0 and a 0 produces a 0, a 1 and a 0 produce a 1, a 0 and a 1 produce a 1, and a 1 and a 1 produce a 0. Applying this truth table to the start and end content values produce 01_1000_1111. The highest order 1 is in the ninth bit so an upper midpoint content value is created by leaving the content value the same above the highest order 1 and changing to 0 bits of lower order than the highest order 1. The upper midpoint content value becomes 01_0000_0000. The lower midpoint content value becomes one less than the upper midpoint content value, or 00_1111_1111.

With the upper and lower midpoint content values defined, an upper range and a lower range are created where the upper range is the start content value to the upper midpoint content value and the lower range is the lower midpoint content value to the end content value. In the example 500, the start content value is above the end content value so the search apparatus 102 first searches the upper range and then searches the lower range. Note that when a sub-range is created outside the start and end content values, the sub-range is not processed so that results outside the start-to-end range are not returned.

Figure 6:
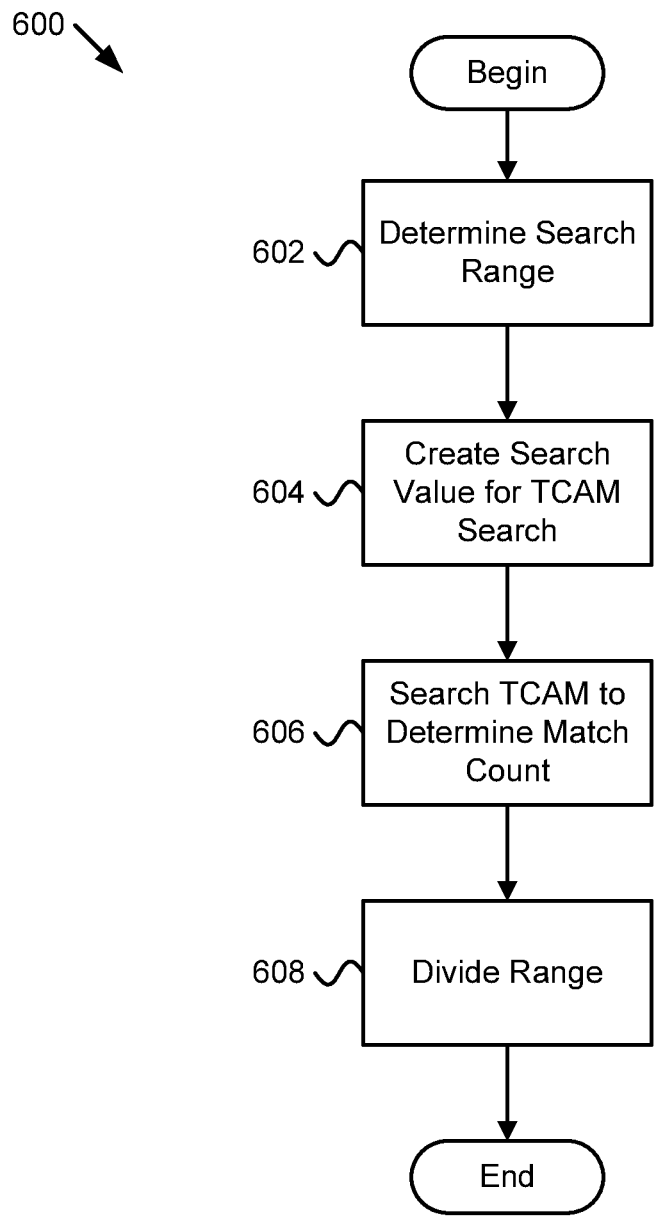
FIG. 6 is a schematic flow chart diagram illustrating one embodiment of a method for an extended TCAM search in accordance with the present invention.

FIG. 6 is a schematic flow chart diagram illustrating one embodiment of a method 600 for an extended TCAM search in accordance with the present invention. The method 600 starts and the range determination module 202 determines 602 a search range of content values within the TCAM 108.

The search range is the difference between an upper content value and a lower content value. The search criteria module 204 creates 604 a search value for a TCAM search from the search range by combining higher order bits that do not change within the search range with a don't care state (masked bits or mbits) in place of lower order bits that change within the search range. The match module 206 searches 606 the TCAM 108 using the search value to determine a match count. The match count includes a number of content values stored in the TCAM 108 within the search range. The division module 208 creates 608 an upper sub-range and a lower sub-range within the search range by creating an upper midpoint content value and a lower midpoint content value within the search range, and the method 600 ends. The upper sub-range is a range between an upper content value of the search range and the upper midpoint content value and the lower sub-range is a range between the lower midpoint content value and a lower content value of the search range. The upper midpoint content value is created by changing a most significant bit of the search value in the don't care state to a logic "1" and the remaining bits in the don't care state to a logic "0." The lower midpoint content value is created by changing a most significant bit of the search value in the don't care state to a logic "0" and the remaining bits in the don't care state to a logic "1."

Figure 7A:
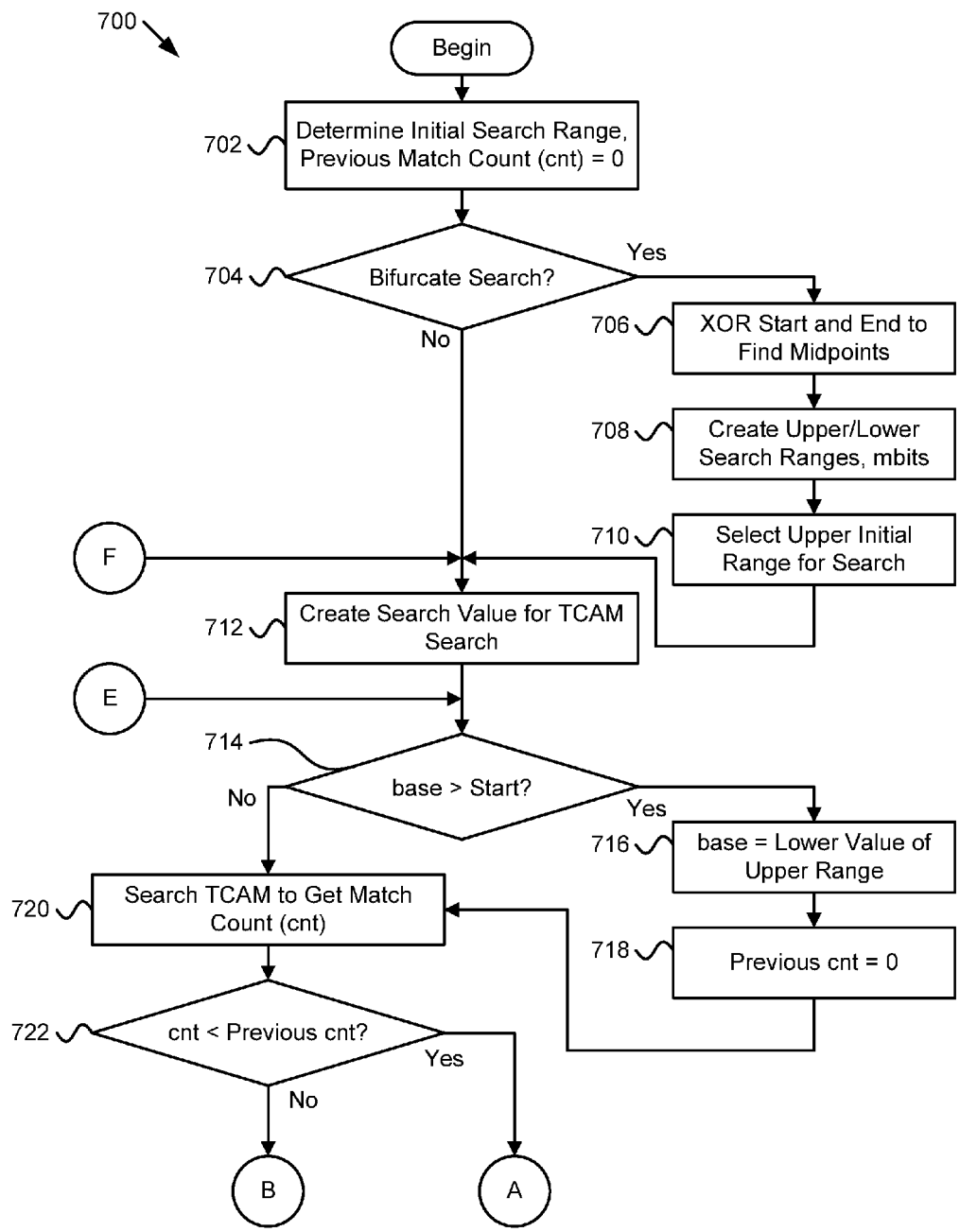
FIG. 7A is a first part of a schematic flow chart diagram illustrating a more detailed embodiment of a method for an extended TCAM search in accordance with the present invention.
Figure 7B:
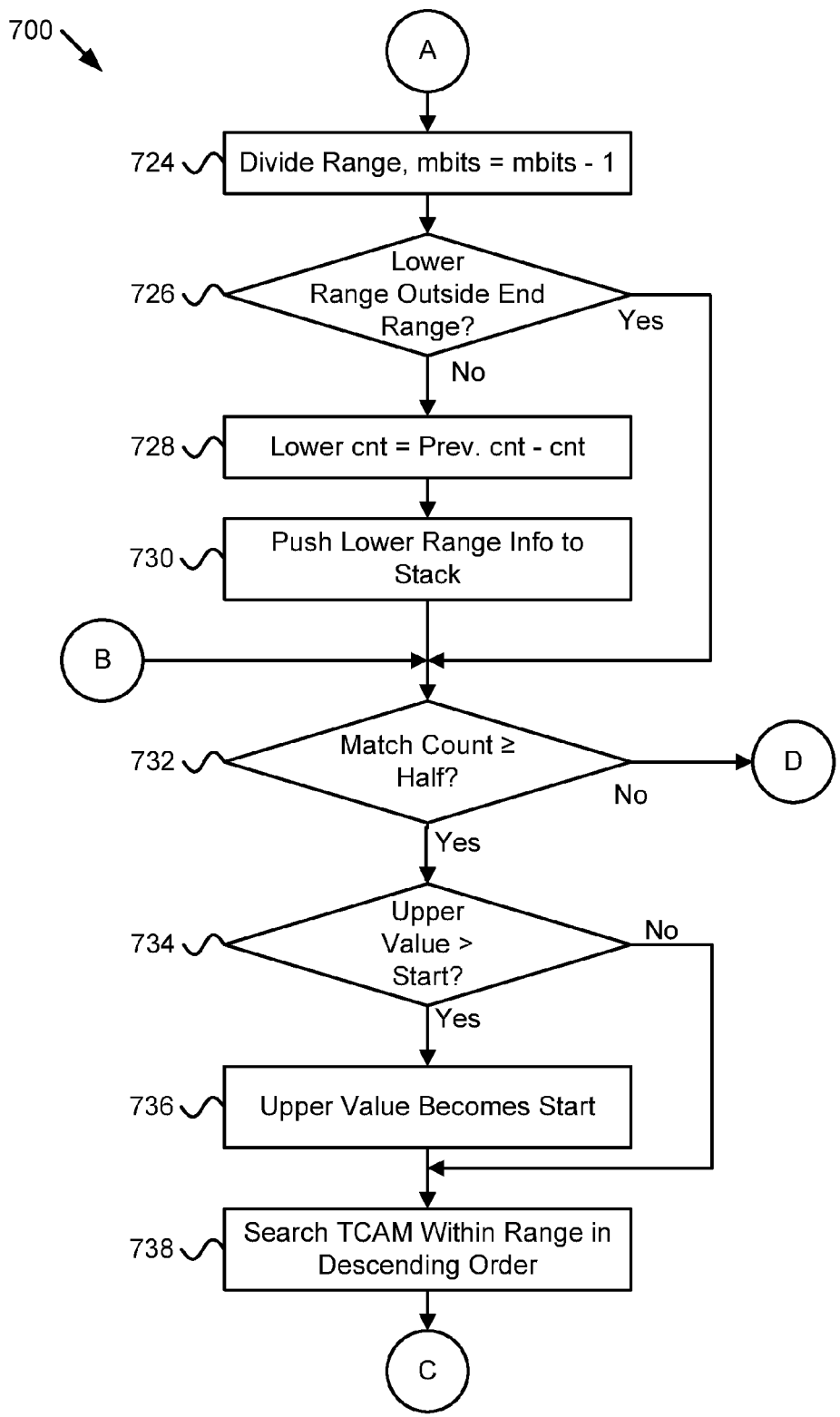
FIG. 7B is a second part of a schematic flow chart diagram illustrating a more detailed embodiment of a method for an extended TCAM search in accordance with the present invention.
Figure 7C:
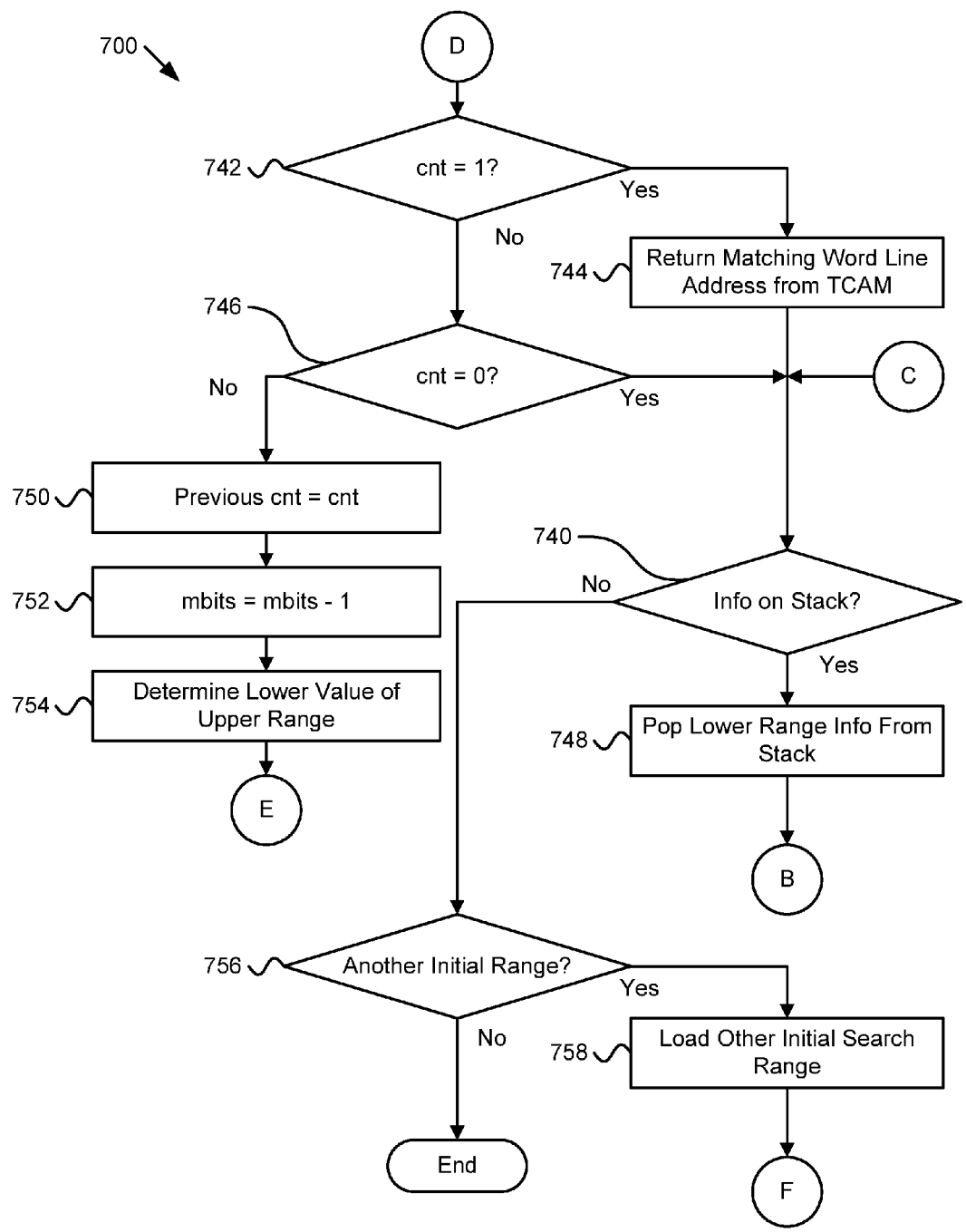
FIG. 7C is a third part of a schematic flow chart diagram illustrating a more detailed embodiment of a method for an extended TCAM search in accordance with the present invention.

FIGS. 7A, 7B, and 7C (collectively FIG. 7) are a first, a second part, and a third part of a schematic flow chart diagram illustrating a more detailed embodiment of a method 700 for an extended TCAM search in accordance with the present invention. The method 700 depicts a search that assembles results in a descending order. One of skill in the art will recognize how to alter the method 700 for an ascending search. The modules 202-208, 302-318, registers 110, address queue 112, etc. of the search apparatus 102 may be used to practice the steps of the method 700

The method 700 begins and determines 702 an initial search range and sets a previous match count variable to zero. (Match count is represented as "cnt" in FIG. 7.) The method 700 determines 704 if the initial range should be bifurcated, as would be the case for the example 500 of FIG. 5. If the method 700 determines 704 that the initial range should be bifurcated, the bifurcation module 318 uses 706 an XOR function on the start and end values to find upper and lower midpoint content values, as described in the example 500 of FIG. 5. The method 700 creates 708 upper and lower initial search ranges and determines mbits for the searches. The method 700 selects 710 the upper initial search range for the search. If the search is an ascending search, in one embodiment, the method 700 selects the lower initial search range for the first search.

The method 700 creates 712 a search value for a TCAM search and determines 714 if a minimum value (i.e. base value) of a search range is greater than the start content value. (The base value is denoted as "base" in FIG. 7.) If the method determines 714 that a minimum value of a search range is greater than the start content value, the method 700 sets 716 the base equal to the lower content value of the upper range and sets 718 the previous match count variable to zero. The method 700 searches 720 the TCAM 108 using the search value to get a match count. If the method determines 714 that a minimum value of a search range is not greater than the start content value, the method 700 searches 720 the TCAM 108 using the search value to get a match count.

The method determines 722 if the match count is less than the previous match count. If the method determines 722 that the match count is less than the previous match count, the method 700 divides 724 the range to create an upper sub-range and a lower sub-range and sets mbits to mbits-1. (Follow A on FIG. 7A to A on FIG. 7B.) For example the division module 208 may divide the range and determine an upper midpoint content value and a lower midpoint content value and the search criteria module 204 may create search values with mbits one less than the range before division.

The method 700 determines 726 if the lower range is outside the end content value of the initial search range. If the method 700 determines 726 that the lower range is not outside the end content value of the initial search range, the method 700 determines 728 that the lower match count is equal to the previous match count minus the current match count. The method 700 pushes 730 the lower sub-range information to the stack. If the method 700 determines 726 that the lower range is outside the end content value of the initial search range, the method 700 does not determine 728 a lower match count and does not push 730 lower range information to the stack. The method 700 determines 732 if the match count is greater than or equal to half of the possible content values in the search range.

If the method determines 722 that the match count is not less than the previous match count, the method 700 determines 732 if the match count is greater than or equal to half of the possible content values in the search range. (Follow B on FIG. 7A to B on FIG. 7B.) If method 700 determines 732 that the match count is greater than or equal to half of the possible content values in the search range, the method 700 determines 734 if the upper content value of the current search range is greater than the start content value. If the method 700 determines 734 that the upper content value of the current search range is greater than the start content value, the method 700 sets 736 the upper content value to be the start content value and searches 738 the TCAM 108 sequentially within the current search range in descending order. If the method 700 determines 734 that the upper content value of the current search range is not greater than the start content value, the method 700 searches 738 the TCAM 108 sequentially within the current search range in descending order.

The method 700 determines 740 if there is information on the stack of a lower sub-range. (Follow C on FIG. 7B to C on FIG. 7C.) If the method 700 determines 732 that the match count is not greater than or equal to half of the possible content values in the search range, the method 700 determines 742 if the current match count is equal to 1. If the method 700 determines 742 that the current match count is equal to 1, the method 700 returns 744 from the TCAM 108 the single word line address associated with the matching word line identified by the match module 206 and determines 740 if there is information on the stack of a lower sub-range.

If the method 700 determines 742 that the current match count is not equal to 1, the method 700 determines 746 if the current match count is equal to zero. If the method 700 determines 746 that the current match count is zero, the method 700 determines 740 if there is information on the stack of a lower sub-range. If the method 700 determines 740 that there is lower sub-range information on the stack, the method 700 pops 748 the lower sub-range information from the stack and determines 732 if the match count is greater than or equal to half of the possible content values in the search range. (Follow B on FIG. 7C to B on FIG. 7B.)

If the method 700 determines 746 that the current match count is not zero, the method 700 sets 750 the previous match count equal to the current count, sets 752 mbits=mbits-1, and determines 754 the lower content value of the upper range and sets the base equal to the lower content value of the upper range. The method 700 returns and determines 714 if a minimum value of a search range is greater than the start content value. (Follow E of FIG. 7C to E of FIG. 7A.)

If the method 700 determines 740 that there is no more information regarding a lower range on the stack, the method 700 determines 756 if there is another initial range to search. If the method 700 determines 756 that there is another initial range, the method 700 loads 758 the other initial search range and returns to create a search value for the TCAM 108. (Follow F on FIG. 7C to F on FIG. 7A.) If method 700 determines 756 that there is not another initial range to search, the method 700 ends.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
  a range determination module that determines a search range of content values within a ternary content addressable memory ("TCAM"), the search range comprising a difference between an upper content value and a lower content value;
  a search criteria module that creates a search value for a TCAM search from a search range by combining higher order bits that do not change within the search range with a don't care state in place of lower order bits that change within the search range;
  a match module that searches the TCAM using the search value to determine a match count, the match count comprising a number of content values stored in the TCAM within the search range; and
  a division module that creates an upper sub-range and a lower sub-range within the search range by creating an upper midpoint content value and a lower midpoint content value within the search range, the upper sub-range comprising a range between an upper content value of the search range and the upper midpoint content value, the lower sub-range comprising a range between the lower midpoint content value and a lower content value of the search range, the upper midpoint content value comprising changing a most significant bit of the search value in the don't care state to a logic "1" and the remaining bits in the don't care state to a logic "0," the lower midpoint content value comprising changing a most significant bit of the search value in the don't care state to a logic "0" and the remaining bits in the don't care state to a logic "1", wherein the range determination module, the search criteria module, the match module and the division module comprise one or more of logic hardware and executable code, the executable code stored on non-transitory computer readable medium.

2. The apparatus of claim 1, further comprising:
  using the search criteria module with one of the upper sub-range and the lower sub-range to create a sub-range search value;
  using the match module to search the sub-range search value to determine a first sub-range match count; and
  further comprising an alternate count module that subtracts the first sub-range match count from a previous match count of the search range prior to division by the division module to determine a second sub-range match count.

3. The apparatus of claim 2, further comprising a division determination module that determines that a range is available for division by the division module in response to a match count of the range available for division comprising a count of matching content value lines less than an upper search threshold and above a lower search threshold.

4. The apparatus of claim 3 wherein the upper search threshold is a count of half of possible matching content values in available for division the range and the lower search threshold is a count of matching content value lines of one.

5. The apparatus of claim 3, further comprising a sequence module that sequentially searches for content values within a sub-range in response to determining that a match count of the sub-range comprises a count of matching content values that is greater than or equal to the upper search threshold.

6. The apparatus of claim 5, further using the search criteria module, the match module, the alternate count module, and the division module for each sub-range with a match count less than the upper search threshold and greater than the lower search threshold until each sub-range match count comprises a count of matching content values that are greater than or equal to the upper search threshold or less than or equal to the lower search threshold, and further comprising using, for each sub-range with a sub-range match count that are greater than or equal to the upper search threshold or less than or equal to the lower search threshold, the sequence module to determine content values within the sub-range.

7. The apparatus of claim 5, further comprising a sequential address module that sequentially stores word line addresses identified as having a content value matching the search value, the word line addresses stored in an address queue.

8. The apparatus of claim 7, further comprising a results return module that sequentially conducts a read operation of memory contents of the TCAM for each word line address stored in the address queue, the read operation returning a content value stored in the TCAM in connection with the word line address.

9. The apparatus of claim 8, further comprising a closest result module that determines a content value returned by the results return module that is a closest content value to a target content value, the target content value within the search range of the upper content value and lower content value.

10. The apparatus of claim 9, further comprising choosing an upper sub-range or a lower sub-range for use with the search criteria module and choosing an ascending or a descending search order with the sequence module to determine content values within a sub-range such that content values determined by the sequence module are identified in an ascending order or descending order in response to the search order module determining an ascending or descending order.

11. The apparatus of claim 7, further comprising a search order module that determines that a search order is ascending in response to a start content value comprising the lower content value and an end content value comprising the upper content value and determines that the search order is descending in response to a start content value comprising the upper content value and an end content value comprising the lower content value.

12. The apparatus of claim 3, further comprising a get address module that returns one or more word line addresses corresponding to one or more matching content value lines matching a sub-range search value in response to determining that a match count of a sub-range is less than or equal to the lower search threshold.

13. The apparatus of claim 3, further comprising taking no action for a sub-range with a sub-range match count of zero.

14. A method comprising:
determining a search range of content values within a ternary content addressable memory ("TCAM"), the search range comprising a difference between an upper content value and a lower content value;
creating a search value for a TCAM search from a search range by combining higher order bits that do not change within the search range with a don't care state in place of lower order bits that change within the search range;
searching the TCAM using the search value to determine a match count, the match count comprising a number of content values stored in the TCAM within the search range; and
creating an upper sub-range and a lower sub-range within the search range by creating an upper midpoint content value and a lower midpoint content value within the search range, the upper sub-range comprising a range between an upper content value of the search range and the upper midpoint content value, the lower sub-range comprising a range between the lower midpoint content value and a lower content value of the search range, the upper midpoint content value comprising changing a most significant bit of the search value in the don't care state to a logic "1" and the remaining bits in the don't care state to a logic "0," the lower midpoint content value comprising changing a most significant bit of the search value in the don't care state to a logic "0" and the remaining bits in the don't care state to a logic "1."

15. The method of claim 14, further comprising:
creating a sub-range search value for a TCAM search for one of the upper sub-range and the lower sub-range;
searching the TCAM using the sub-range search value to determine a first sub-range match count; and
subtracting the sub-range match count from a previous match count of the search range prior to division to determine a second sub-range match count.

16. The method of claim 15, further comprising determining that a range is available for division in response to a match count of the range available for division comprising a count of matching content value lines less than an upper search threshold and above a lower search threshold.

17. The method of claim 15, further comprising:
sequentially searching for content values matching the sub-range search value in response to determining that a match count of a range comprises a count of matching content values that is greater than or equal to the upper search threshold;
returning one or more word line addresses corresponding to one or more matching content value lines matching a sub-range search value in response to determining that a match count of a sub-range is one; and
for each sub-range with a match count less than an upper search threshold and greater than a lower search threshold, dividing the sub-range into additional sub-ranges, creating a sub-range search value for a TCAM search for each additional sub-range, searching the TCAM within each additional sub-range using the sub-range search value for the corresponding additional sub-range, determining a sub-range match count for each of the additional sub-ranges until each sub-range match count comprises a count of matching content values that are greater than or equal to the upper search threshold or lower than or equal to the lower search threshold; and
for each sub-range with a sub-range match count of matching content values that are greater than or equal to the upper search threshold or less than or equal to the lower search threshold, determining content values matching a sub-range search value.

18. A system comprising:
a ternary content addressable memory ("TCAM");

a control unit for searching the TCAM, the control unit comprising a range determination module that determines a search range of content values within the TCAM, the search range comprising a difference between an upper content value and a lower content value;

a search criteria module that creates a search value for a TCAM search from a search range by combining higher order bits that do not change within the search range with a don't care state in place of lower order bits that change within the search range;

a match module that searches the TCAM using the search value to determine a match count, the match count comprising a number of content values stored in the TCAM within the search range; and a division module that creates an upper sub-range and a lower sub-range within the search range by creating an upper midpoint content value and a lower midpoint content value within the search range, the upper sub-range comprising a range between an upper content value of the search range and the upper midpoint content value, the lower sub-range comprising a range between the lower midpoint content value and a lower content value of the search range, the upper midpoint content value comprising changing a most significant bit of the search value in the don't care state to a logic "1" and the remaining bits in the don't care state to a logic "0," the lower midpoint content value comprising changing a most significant bit of the search value in the don't care state to a logic "0" and the remaining bits in the don't care state to a logic "1."

19. The system of claim 18, further comprising an electronic device comprising the TCAM and the control unit.

20. An apparatus comprising:

a range determination module that determines a search range of content values within a ternary content addressable memory ("TCAM"), the search range comprising a difference between an upper content value and a lower content value;

a search criteria module that creates a search value for a TCAM search from a search range by combining higher order bits that do not change within the search range with a don't care state in place of lower order bits that change within the search range;

a match module that searches the TCAM using the search value to determine a match count, the match count comprising a number of content values stored in the TCAM within the search range;

a division module that creates an upper sub-range and a lower sub-range within the search range by creating an upper midpoint content value and a lower midpoint content value within the search range, the upper sub-range comprising a range between an upper content value of the search range and the upper midpoint content value, the lower sub-range comprising a range between the lower midpoint content value and a lower content value of the search range, the upper midpoint content value comprising changing a most significant bit of the search value in the don't care state to a logic "1" and the remaining bits in the don't care state to a logic "0," the lower midpoint content value comprising changing a most significant bit of the search value in the don't care state to a logic "0" and the remaining bits in the don't care state to a logic "1";

a sub-range module that uses the search criteria module with one of the upper sub-range and the lower sub-range to create a sub-range search value and uses the match module to search the sub-range search value to determine a first sub-range match count;

an alternate count module that subtracts the first sub-range match count from a previous match count of the search range prior to division by the division module to determine a second sub-range match count;

a division determination module that determines that a range is available for division by the division module in response to a match count of the range available for division comprising a count of matching content value lines less than an upper search threshold and above a lower search threshold;

a sequence module that sequentially searches for content values within a sub-range in response to determining that a match count of a range comprises a count of matching content values that is greater than or equal to the upper search threshold;

returning one or more word line addresses corresponding to one or more matching content value lines matching the sub-range search value in response to determining that a match count of a sub-range is less than or equal to the lower search threshold;

a sequential address module that sequentially stores word line addresses identified as having a content value matching the sub-range search value, the word line addresses stored in an address queue; and a results return module that sequentially conducts a read operation of memory contents of the TCAM for each word line address stored in the address queue, the read operation returning a content value stored in the TCAM in connection with the word line address, wherein the range determination module, the search criteria module, the match module, the division module, the sub-range module, the alternate count module, the division determination module, the sequence module, the sequential address module and the results return module comprise one or more of logic hardware and executable code, the executable code stored on non-transitory computer readable medium.

* * * * *